US012719031B2

(12) United States Patent
Yang et al.

(10) Patent No.: US 12,719,031 B2
(45) Date of Patent: Aug. 25, 2026

(54) SUBTRACTIVE COPPER ETCH

(71) Applicant: Lam Research Corporation, Fremont, CA (US)

(72) Inventors: Wenbing Yang, Campbell, CA (US); Ran Lin, Fremont, CA (US); Samantha SiamHwa Tan, Newark, CA (US); Mohand Brouri, Brussels (BE); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 485 days.

(21) Appl. No.: 18/010,422

(22) PCT Filed: Aug. 12, 2021

(86) PCT No.: PCT/US2021/045807

§ 371 (c)(1),
(2) Date: Dec. 14, 2022

(87) PCT Pub. No.: WO2022/046429

PCT Pub. Date: Mar. 3, 2022

(65) Prior Publication Data

US 2023/0298869 A1 Sep. 21, 2023

Related U.S. Application Data

(60) Provisional application No. 63/071,227, filed on Aug. 27, 2020.

(51) Int. Cl.
*H01J 37/32* (2006.01)
*H10P 50/26* (2026.01)

(52) U.S. Cl.
CPC .. *H01J 37/32816* (2013.01); *H01J 37/32091* (2013.01); *H10P 50/267* (2026.01); *H01J 2237/3341* (2013.01)

(58) Field of Classification Search
CPC ........... H01J 37/32816; H01J 37/32091; H01J 2237/3341; H01L 21/32136;
(Continued)

(56) References Cited

U.S. PATENT DOCUMENTS 6,008,140 A 12/1999 Ye et al.
6,489,247 B1 * 12/2002 Ye .................... H01L 21/32136 216/75

(Continued)

FOREIGN PATENT DOCUMENTS

KR 10-1999-0072296 9/1999
KR 2006-0121269 11/2006

(Continued)

OTHER PUBLICATIONS

WO-2018088532-A1, Machine Translation. (Year: 2025).*

(Continued)

*Primary Examiner* — Binh X Tran
*Assistant Examiner* — Christopher Remavege
(74) *Attorney, Agent, or Firm* — Beyer Law Group LLP

(57) ABSTRACT

A method for atomic layer etching copper or copper alloy over a substrate in a plasma processing chamber comprising a plurality of cycles is provided. Each cycle of the plurality of cycles comprises a copper modification phase and an activation phase. The copper modification phase comprises flowing a modification gas into the plasma processing chamber, transforming the modification gas into a modification plasma, and exposing the copper or copper alloy to the modification plasma, wherein at least a part of the copper or copper alloy is modified. The activation phase comprises flowing an activation gas into the plasma processing chamber, wherein the activation gas, comprises a hydrogen containing gas, transforming the activation gas into an activation plasma, and exposing the modified copper or copper (Continued)

alloy to the activation plasma, wherein at least a volatile copper or copper alloy complex is formed.

18 Claims, 9 Drawing Sheets

(58) Field of Classification Search
CPC ......... H01L 21/67109; H01L 21/67248; H01L 21/6831; H01L 21/32139; H01L 21/67069; H01L 21/67167; H01L 21/67207
See application file for complete search history.

(56) References Cited

U.S. PATENT DOCUMENTS 6,534,416 B1 * 3/2003 Ye .................... H01L 21/32136 438/720
7,232,766 B2 * 6/2007 Bailey, III ........ H01L 21/32136 438/715
8,539,257 B2 * 9/2013 Schauer ........... G05B 19/41865 713/323
10,727,073 B2 7/2020 Tan et al.
11,199,363 B2 * 12/2021 Roozeboom .......... F28F 9/0246
11,600,465 B2 * 3/2023 Fang ................ H01J 37/32009
2001/0032589 A1 * 10/2001 Kirimura ................ C30B 29/06 117/103
2002/0045354 A1 * 4/2002 Ye .................... H01L 21/32136 438/720
2004/0038541 A1 * 2/2004 Baier ................ H01L 21/02071 438/723
2005/0158999 A1 * 7/2005 Lin ...................... H01L 21/321 257/E21.582
2006/0014394 A1 * 1/2006 Kulkarni ........... H01L 21/32136 216/75
2009/0269507 A1 * 10/2009 Yu .......................... C23C 16/18 427/124
2011/0114375 A1 * 5/2011 Ohmi .................... H05K 3/388 29/829
2012/0125765 A1 * 5/2012 Ohmi ................... C23C 14/024 204/298.16
2013/0105303 A1 * 5/2013 Lubomirsky ....... H01L 21/6831 204/192.34
2014/0110373 A1 * 4/2014 Nishimura ........ H01L 21/31122 216/41
2016/0042975 A1 * 2/2016 Ma .................... H01L 21/32139 438/720
2017/0036419 A1 * 2/2017 Adib ...................... B32B 17/06
2017/0229314 A1 * 8/2017 Tan ...................... H01J 37/321
2018/0090502 A1 * 3/2018 Shimamoto ............. H01L 22/20
2020/0142327 A1 * 5/2020 Roozeboom .......... F28F 9/0265

FOREIGN PATENT DOCUMENTS

KR 10-1127778 3/2012
KR 2017-0093080 8/2017
KR 2020-0008030 1/2020
KR 2020-0019635 2/2020
TW 396429 7/2000
TW 200526813 8/2005
TW 201907241 2/2019
WO WO-2004053978 A1 * 6/2004 ........ H01L 21/31116
WO WO-2018088532 A1 * 5/2018 ............... H05H 1/46
WO 2018/236651 12/2018

OTHER PUBLICATIONS

Taiwanese Office Action from Taiwanese Application No. 110131186 dated Dec. 30, 2024 with Machine Translation.
International Search Report and Written Opinion for International Application No. PCT/US2021/045807.
Korean Office Action from Korean Application No. 10-2022-7044022 dated May 30, 2025 with Machine Translation.
Fangyu Wu, Galit Levitin, Dennis W. Hess. “Mechanistic Considerations of Low Temperature Hydrogen-based Plasma Etching of Cu.” American Vacuum Society dated Oct. 13, 2011.

* cited by examiner

Copper
Nitrogen ion Species
312
304
212

316
304
212

Copper
Nitrogen Ion Species
Hydrogen Ion Species

SUBTRACTIVE COPPER ETCH

CROSS-REFERENCE TO RELATED APPLICATION

This application claims the benefit of priority of U.S. Application No. 63/071,227, filed Aug. 27, 2020, which is incorporated herein by reference for all purposes.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor fabrication processes often involve the formation of metal-containing structures including logic and memory. Subtractive etching processes have been used to fabricate aluminum-containing structures, and as the industry shifted towards the use of copper, the Damascene processing scheme was created to accommodate for the difficulty of etching copper in subtractive etching processes. However, as devices shrink, it becomes increasingly difficult to form small copper features using the damascene process.

As interconnect technology switched from aluminum (Al) to copper (Cu), the integration flow evolved from metal etch to the dual-damascene process due to the challenges from etching copper. The dual-damascene process has been the mainstream technology for Cu structure patterning for decades. The dual-damascene process involves three major steps: First, the trenches or vias are defined by etching a dielectric layer, then Cu is deposited into the structure using dry processes (physical vapor deposition (PVD), chemical vapor deposition (CVD)) and/or wet approaches (e.g. electroless deposition (ELD)), and then finally use chemical mechanical polishing (CMP) to remove the overburden to form such structures for Cu interconnects. To meet the evolving resistance capacitance (RC) requirements for metal structures as feature shrinks, few metals (such as tungsten (W), molybdenum (Mo), and ruthenium (Ru)) emerge as promising candidates with a premium electric property. Subtractive metal etch has being developed and integrated to pattern those metals. Etching of such metals may have problems where wider features may etch faster than narrower features and sidewalls of metal features may be too rough.

One approach to etching copper uses ion beam etch (IBE) technology based on physical bombardment. IBE is used to etch materials that do not form volatile byproducts in traditional plasma etch processes. Reactive ion etch (RIE) processes also have been used for copper etching. Examples including a chlorine ($Cl_2$)-based RIE process to form a copper(I) chloride (CuCl) byproduct; and hydrogen ($H_2$) RIE at low temperature to form a copper hydride (CuH) etch byproduct, or hydrogen/nitrogen ($H_2/N_2$) based plasma RIE process at high pressure to increase the etch rate. In the integration flow to process barrier films under a copper layer, plasma etching with $H_2$ and halogen gas has been developed, which can be integrated with or without a wet and dry cyclical process.

SUMMARY

To achieve the foregoing and in accordance with the purpose of the present disclosure, a method for atomic layer etching copper or copper alloy over a substrate in a plasma processing chamber comprising a plurality of cycles is provided. Each cycle of the plurality of cycles comprises a copper modification phase and an activation phase. The copper modification phase comprises flowing a modification gas into the plasma processing chamber, transforming the modification gas into a modification plasma, and exposing the copper or copper alloy to the modification plasma, wherein at least a part of the copper or copper alloy is modified. The activation phase comprises flowing an activation gas into the plasma processing chamber, wherein the activation gas comprises a hydrogen containing gas, transforming the activation gas into an activation plasma, and exposing the modified copper or copper alloy to the activation plasma, wherein at least a volatile copper or copper alloy complex is formed.

In another manifestation, a method for etching copper or copper alloy over a substrate in a plasma processing chamber is provided. An etch gas comprising a modification gas and hydrogen containing gas is flowed into the plasma processing chamber. The etch gas is transformed into a plasma. A bias is provided, wherein the plasma etches at least a part of the copper or copper alloy.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
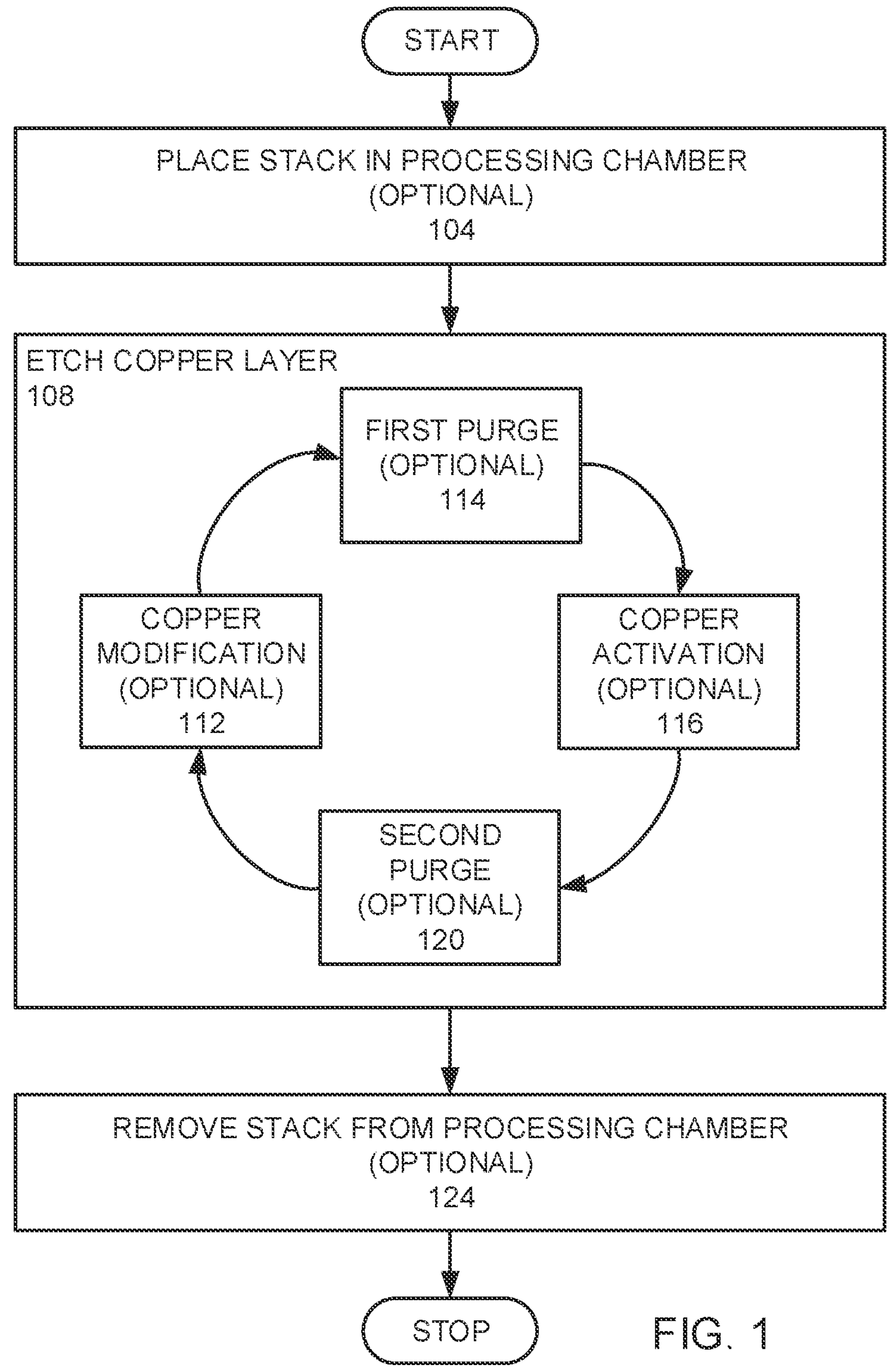
FIG. 1 is a high level flow chart of an embodiment.
Figure 2A:
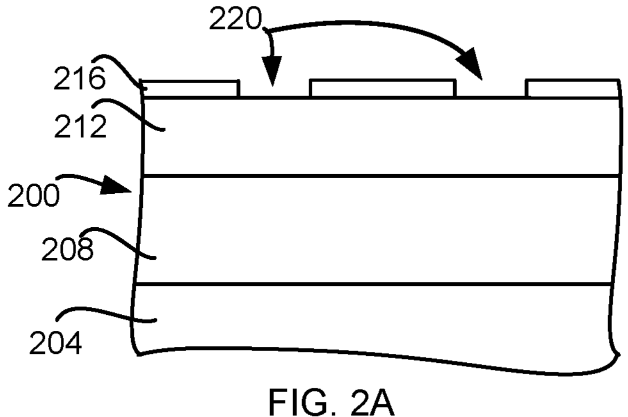
FIGS. 2A-B are schematic cross-sectional views of a structure processed according to an embodiment.

FIG. 1 is a high level flow chart of an embodiment. In this embodiment, a substrate with a structure, such as a stack with a copper layer, is placed in a plasma processing chamber (step 104). The stack may include any of a number of additional layers with materials appropriate for any useful purpose. For example, FIG. 2A is a schematic partial cross-sectional view of an example stack 200. As shown, the stack 200 includes a semiconductor substrate 204, under an intermediate layer 208, under a copper layer 212. In this example, the copper layer 212 is made of copper or a copper alloy. A patterned mask 216 with patterned openings 220 was formed over the copper layer 212. In this embodiment, the patterned mask 216 is a hardmask made of at least one of silicon oxide ($SiO_2$), silicon nitride (SiN), tantalum nitride (TaN), and titanium nitride (TiN). The stack 200 is placed in a plasma processing chamber (step 104).

Figure 3A:
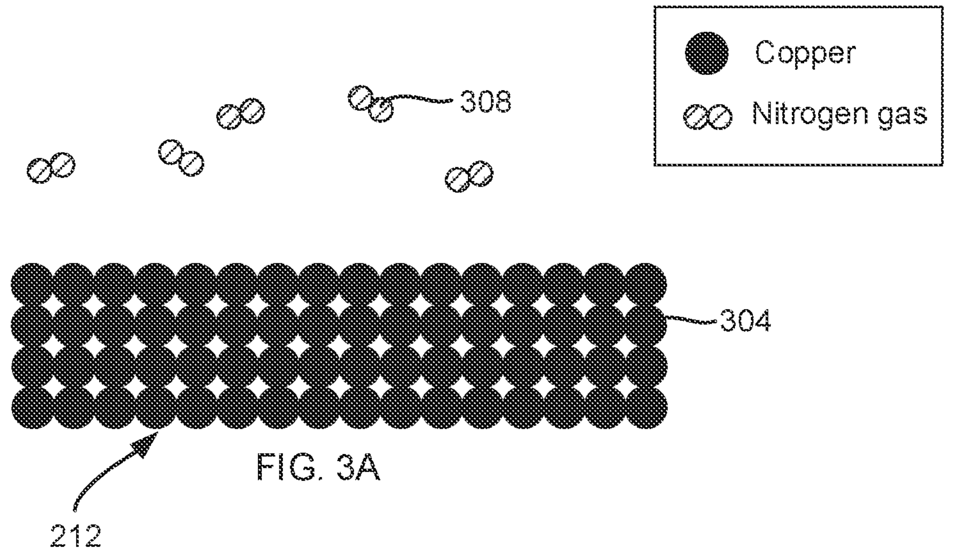
FIGS. 3A-E are more detailed schematic views of the structured process according to an embodiment.

In the processing chamber, the stack 200 is subjected to a copper layer etch (step 108). The copper layer etch (step 108) comprises a plurality of cycles, where each cycle comprises a copper modification phase (step 112), an optional first purge (step 114), an activation phase (step 116), and an optional second purge (step 120). In some embodiments, the copper modification phase (step 112) and/or the activation phase (step 116) may be optional steps. During the copper modification phase (step 112) a modification gas is flowed into the plasma processing chamber. The modification gas may be any gas suitable for modifying part of the copper layer 212. In this embodiment, the modification gas comprises nitrogen gas ($N_2$). In various embodiments, other gases may be added in the modification gas, such as at least one of ammonia ($NH_3$), nitric oxide (NO), or oxygen ($O_2$), or combinations thereof. Pressure in the range of 10 millitorrs (mTorr) and 100 mTorr is provided. The substrate is maintained at a temperature in the range of −40° C. and 20° C. As further illustrated, FIG. 3A is an enlarged view of part of the copper layer 212, showing copper atoms 304. A nitrogen gas 308 is flowed into the plasma processing chamber.

Figure 3B:
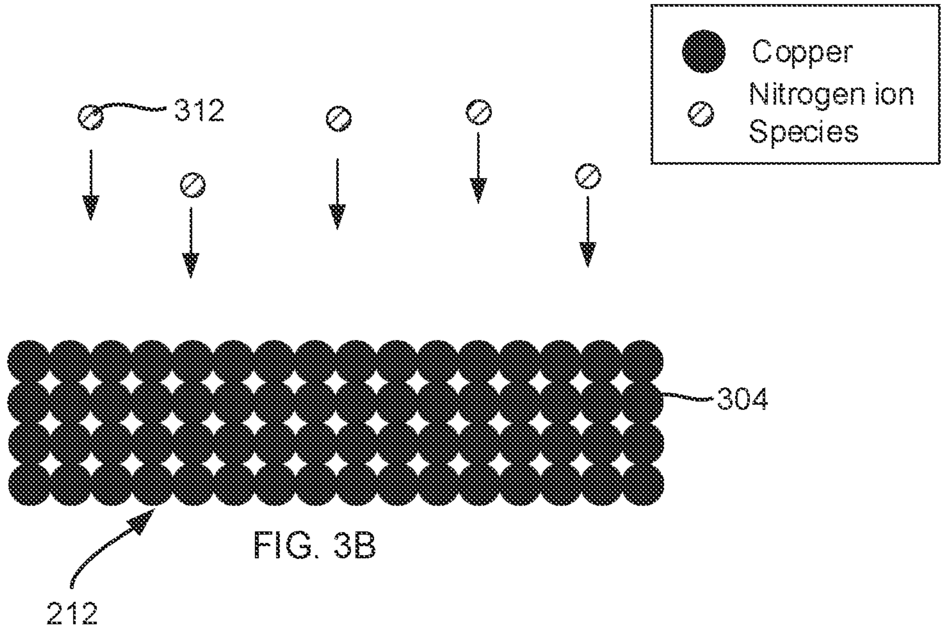

The modification gas is transformed into a modification plasma. In this example, radio frequency (RF) power at a frequency of 13.56 MHz is provided at a power of 300-1800 Watts (W) to transform the modification gas into a modification plasma. A bias is provided in a range of about 50 volts to 500 volts. In this embodiment, the nitrogen gas is transformed into nitrogen ion species. FIG. 3B is an enlarged view of part of the copper layer 212, illustrating the nitrogen ion species 312. In some instances, a bias may be provided that accelerates the nitrogen ion species 312 towards the copper layer 212.

Figures 3C, 3D:
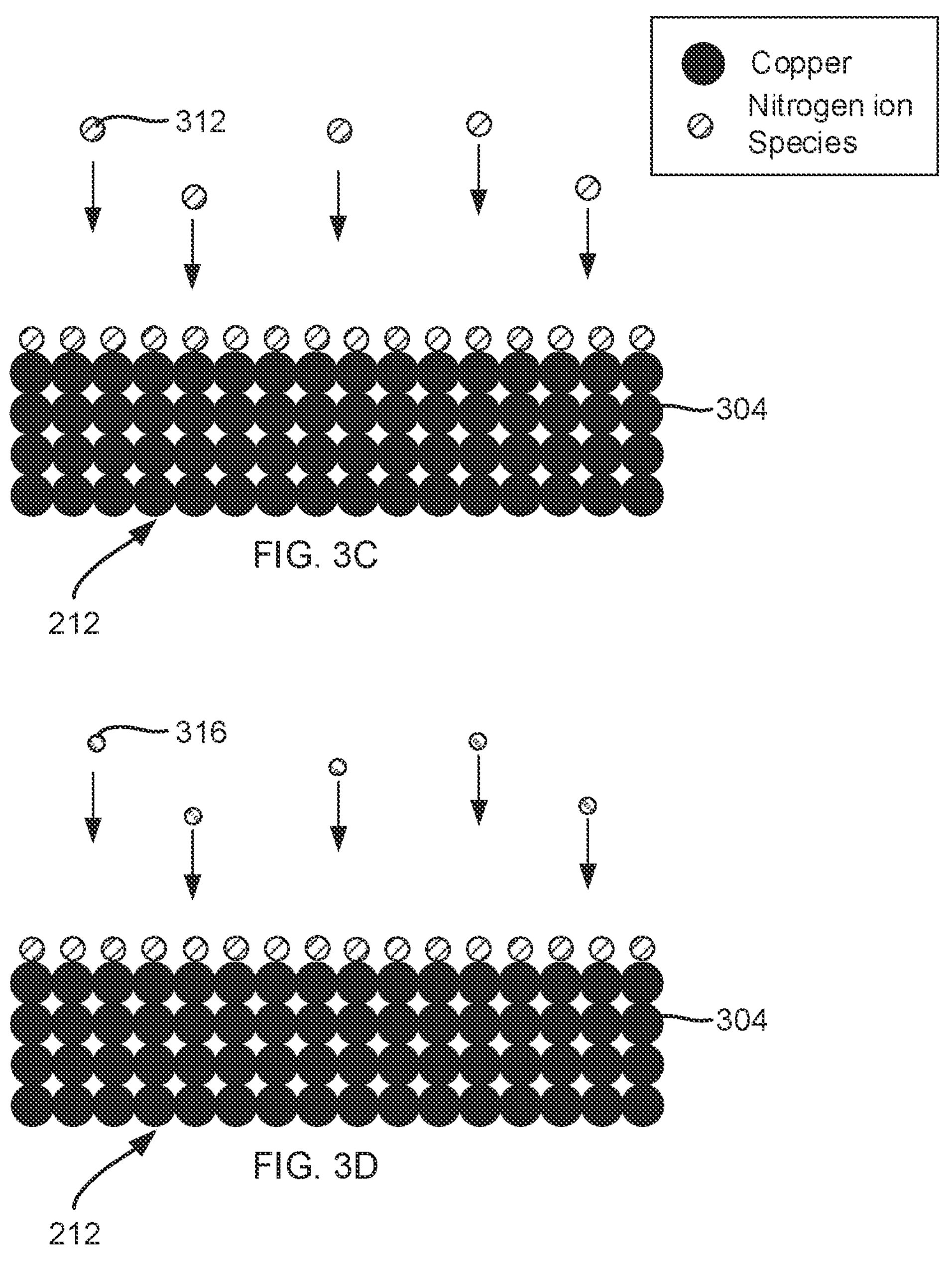

The copper layer 212 is exposed to the modification gas so that the copper or copper alloy in the copper layer 212 is modified. In this embodiment, a monolayer of the copper or copper alloy is modified. In this embodiment, the nitrogen ion species 312 bonds to atoms of copper on the surface of the copper layer 212. FIG. 3C is an enlarged view of part of the copper layer 212, after a layer of nitrogen ion species 312 has bonded to an upper layer of copper of the copper layer 212. The bonding of the nitrogen ion species 312 may be according to the reaction: $Cu+N \rightarrow CuN$. The nitrogen ion species 312 forms a monolayer of CuN at the top surface of the copper layer 212.

After the modification phase is completed, the modification phase is stopped. The modification phase may be stopped by stopping the flow of the modification gas, or changing the excitation power for forming a plasma, or changing the bias power, or by flowing a purge gas. The modification phase may also be stopped when the modification gas has been exhausted. Thus as shown in FIG. 1, optionally a purge gas may be flowed to purge the modification gas providing a first purge (step 114) in some embodiments. However, other embodiments may not have a first purge.

After the copper modification phase is completed (step 112) or after the first purge (step 114), an activation phase is provided (step 116). During the activation phase (step 116) an activation gas is flowed into the plasma processing chamber. The activation gas may be any gas suitable for volatilizing the modified copper or copper alloy. In this embodiment, the activation gas comprises hydrogen gas ($H_2$). In other embodiments, the activation gas may be at least one of methane ($CH_4$), ammonia ($NH_3$), silane ($SiH_4$), water ($H_2O$), or methanol ($CH_3OH$), or combinations thereof. Pressure in the range of 10 mTorr and 100 mTorr is provided. The substrate is maintained at a temperature in the range of −40° C. and 20° C. The activation gas is transformed into an activation plasma. In this example, RF power at a frequency of 13.56 MHz is provided at a power of 300-1800 Watts (W) to transform the activation gas into an activation plasma. A bias is provided in a range of about 50 volts to 500 volts. In this embodiment, the hydrogen gas is transformed into hydrogen ion species. FIG. 3D is an enlarged view of part of the copper layer 212, illustrating the hydrogen ion species 316. In some instances, a bias may be provided that accelerates the hydrogen ion species 316 towards the copper layer 212.

Figure 3E:
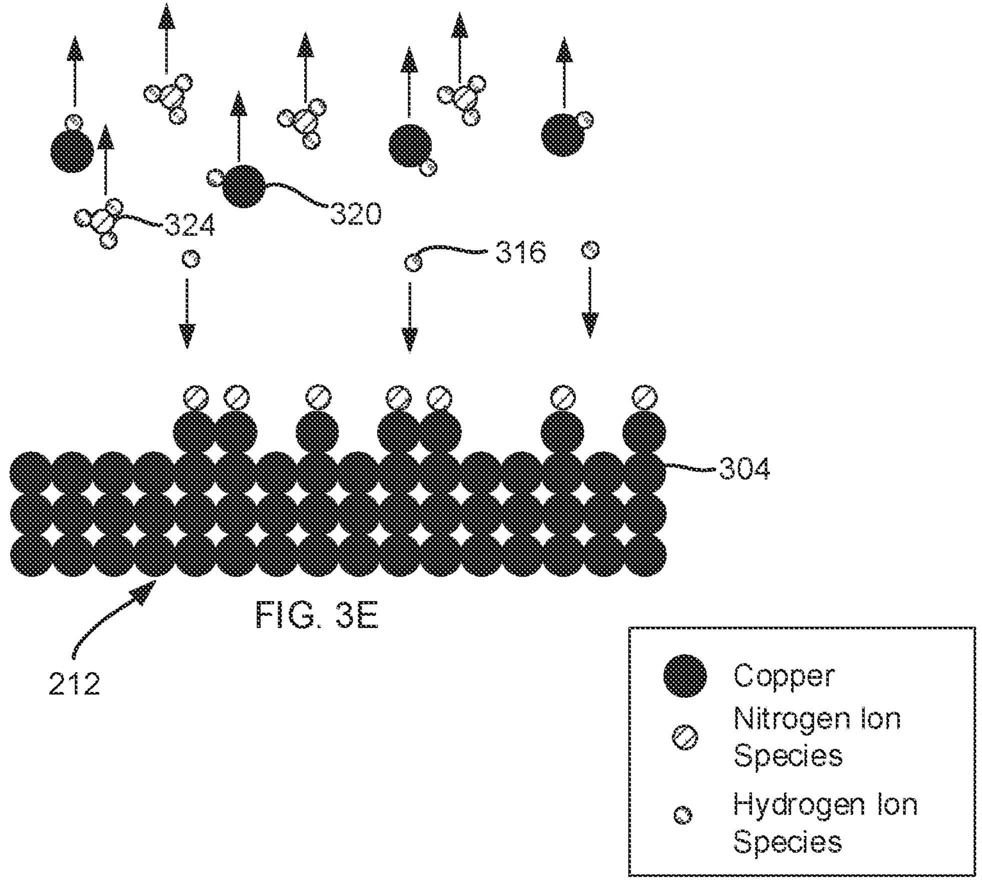

The hydrogen ion species 316 reacts with the CuN monolayer according to the reaction $CuN+4H \rightarrow CuH+NH_3$. FIG. 3E is an enlarged view of part of the copper layer 212, illustrating how the hydrogen ion species 316 activates CuN to form CuH 320 and ammonia ($NH_3$) 324. CuH 320 and $NH_3$ 324 are volatile and neutral and may be removed in the gas exhaust. Therefore, this embodiment is able to form copper or copper alloy from the copper layer 212 into a volatile copper or copper alloy complex. The activation phase is complete when the CuN is removed. As a result, a monolayer of copper is removed.

After the activation phase is completed, the activation phase is stopped. The activation phase may be stopped by stopping the flow of the activation gas, or changing the excitation power for forming a plasma, or changing the bias power, or by flowing a purge gas. The activation phase may also be stopped naturally when the activation gas is exhausted. A purge gas may be flowed to purge the activation gas providing a second purge (step 120) in some embodiments. However, other embodiments may not have a second purge.

Figure 2B:
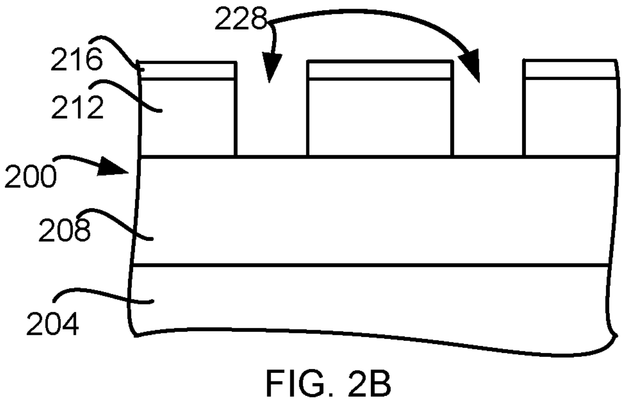

After the activation phase is completed (step 116) or after the second purge (step 120) the cycle returns to the copper modification phase (step 112). The cycle may be repeated a plurality of times until the copper layer 212 is etched to a sufficient depth. FIG. 2B is a schematic cross-sectional view of a stack 200 after features 228 have been etched into the copper layer 212 by transferring a pattern from the hardmask 216 to the copper layer 212.

This embodiment provides an atomic layer etch that enables critical copper patterning including subtractive etching and Cu recessing that previously might have been conducted via a CMP process. In some embodiments, the process requires a processing chamber with minimum halogen contamination. In such embodiments, a platform may be provided with a separate chamber for mask patterning that might use a halogen plasma and a separate chamber for Cu etch. An example of a mask patterning process is a process used to etch the hardmask in a halogen etch chamber. In addition, in such embodiments the atomic layer etch is a halogen free process.

Compared with an IBE subtractive etch, various embodiments provide a higher aspect ratio structure. IBE depends on the physical sputter of ion beams so that there is a shadow effect that prevents the IBE technique being used from providing a structure with high aspect ratios or tight pitches.

In addition, in IBE, redeposition also occurs from mask materials and the target layer that induces a mixed layer on the etch front or sidewall. Various embodiments have the advantage of patterning high aspect ratios or tight pitches, in order to prevent surface damage from mask materials.

In other embodiments, other modification gases may be used. Other modification gases may be at least one of an oxygen containing gas, a halogen containing gas, a sulfide containing gas, or a phosphide containing gas, or combinations thereof. The modification reaction would be Cu+X→CuX, where X is one or more species of a plasma formed from the modification gas. In other embodiments, the activation gas may be other hydrogen containing gases or hydrogen and nitrogen containing gases, such as hydrogen gas, ammonia, methane, and a gas mixture of $H_2$ and $N_2$. The activation reaction is generalized by the reaction formula CuX+H→CuH+X.

In other embodiments, the provided pressure is in the range between 20 mTorr and 70 mTorr. In other embodiments, the pressure is in the range between 3 mTorr and 300 mTorr. In other embodiments, the substrate is maintained at a temperature in the range of −60° C. and 40° C. In some embodiments, the substrate is maintained at a temperature in the range of −40° C. and 10° C., during the activation phase because at higher temperatures, CuH tends to breakdown more quickly. In other embodiments, the bias is provided in a range of about 40 volts to 700 volts. In various embodiments, the bias may be continuous or pulsed or combinations thereof. A pulsed bias may use pulse frequency, pulse amplitude, and pulse duty cycle as tuning parameters. For a pulsed bias, a bias voltage may be in the range of 40 volts to 1500 volts.

The atomic layer etch is able to remove a monolayer for each cycle. Such a process provides a uniform and conformal removal. The ALE is able to selectively etch copper with respect to silicon oxide or silicon nitride with an etch selectivity of at least 5:1.

Figure 4:
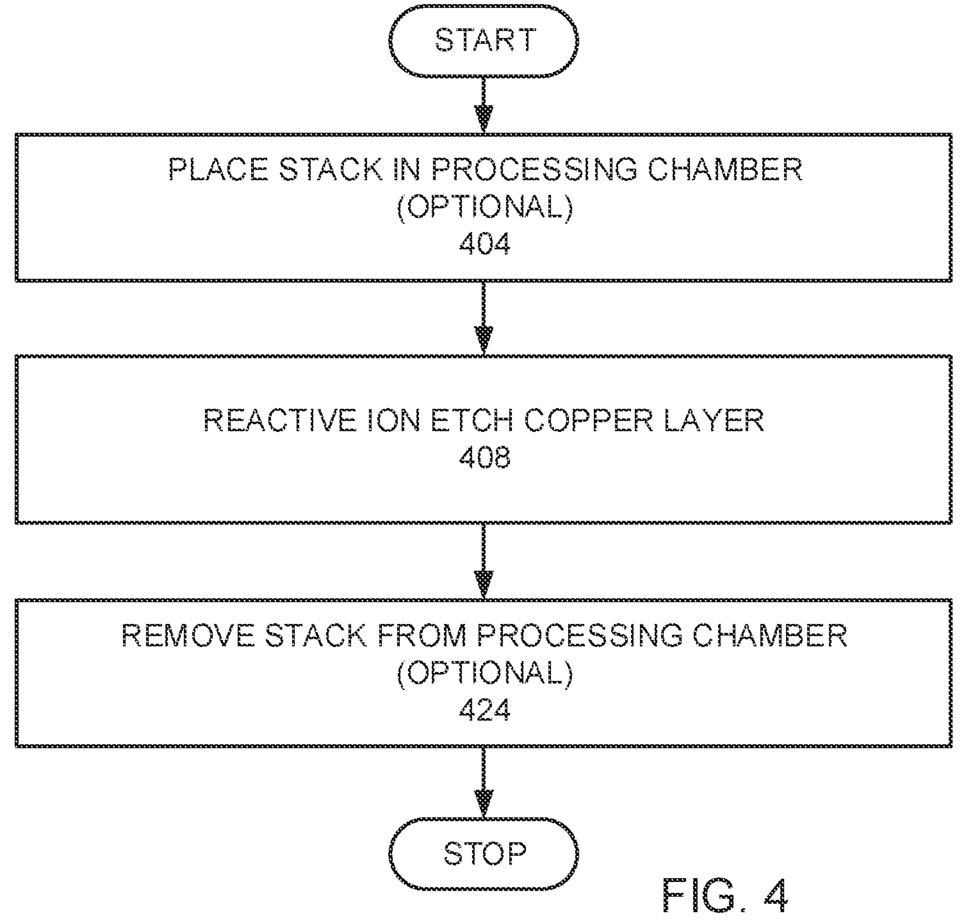
FIG. 4 is a high level flow chart of another embodiment.

FIG. 4 is a high level flow chart of another embodiment that provides a reactive ion etch of a copper layer. In this embodiment, a substrate with a structure, such as a stack with a copper layer, is placed in a processing chamber (step 404). The stack may be like the stack 200 with a copper layer 212, shown in FIG. 2A.

A reactive ion etch of the copper layer 212 is provided into a plasma processing chamber (step 408). The reactive ion etch comprises flowing an etch gas comprising a modification gas and hydrogen containing gas into the plasma processing chamber at a pressure in a range of 10 mTorr and 100 mTorr. In other embodiments, the modification gas and hydrogen containing gas are flowed into the plasma processing chamber at a pressure in a range of 3 mTorr and 1000 mTorr. The etch gas is transformed into a plasma, by providing an RF power. A bias in the range of 50 volts and 500 volts is provided where the plasma etches at least a part of the copper layer. The bias may be provided as a continuous bias or a pulsed bias or a combination thereof. If the bias is a continuous bias, the bias voltage may be in the range of 50 volts to 500 volts. If the bias is a pulsed bias, the voltage may be in the range of 50 volts to 1500 volts. In some embodiments, the bias may be as high as 2000 volts. For such a pulsed bias a duty cycle in the range of 1% to 90% may be used, at a frequency in the range of 10 Hz to 900 Hz. The substrate is maintained at a temperature in the range of −40° C. and 20° C. After the copper layer 212 is etched the stack is removed from the plasma processing chamber (step 424). By providing a controlled bias and pressure, a more controlled and better tuned etching is provided, providing improved etch results. The voltage, duty cycle, and frequency of the bias may be used as control parameters.

In various embodiments, the modification gas may be at least one of an oxygen containing gas, a nitrogen containing gas, a halogen containing gas, a sulfide containing gas, or a phosphide containing gas or combinations thereof. The modification reaction would be Cu+X→CuX, where X is one or more species of a plasma formed from the modification gas. The hydrogen containing gas may be at least one of a hydrogen gas, ammonia, methane, or a gas mixture of $H_2$ and $N_2$, or combinations thereof.

The resulting reactive ion etch may be faster than an ALE process. However, the RIE process may not be as uniform or conformal as an ALE process. Some embodiments are halogen free processes.

Figure 5:
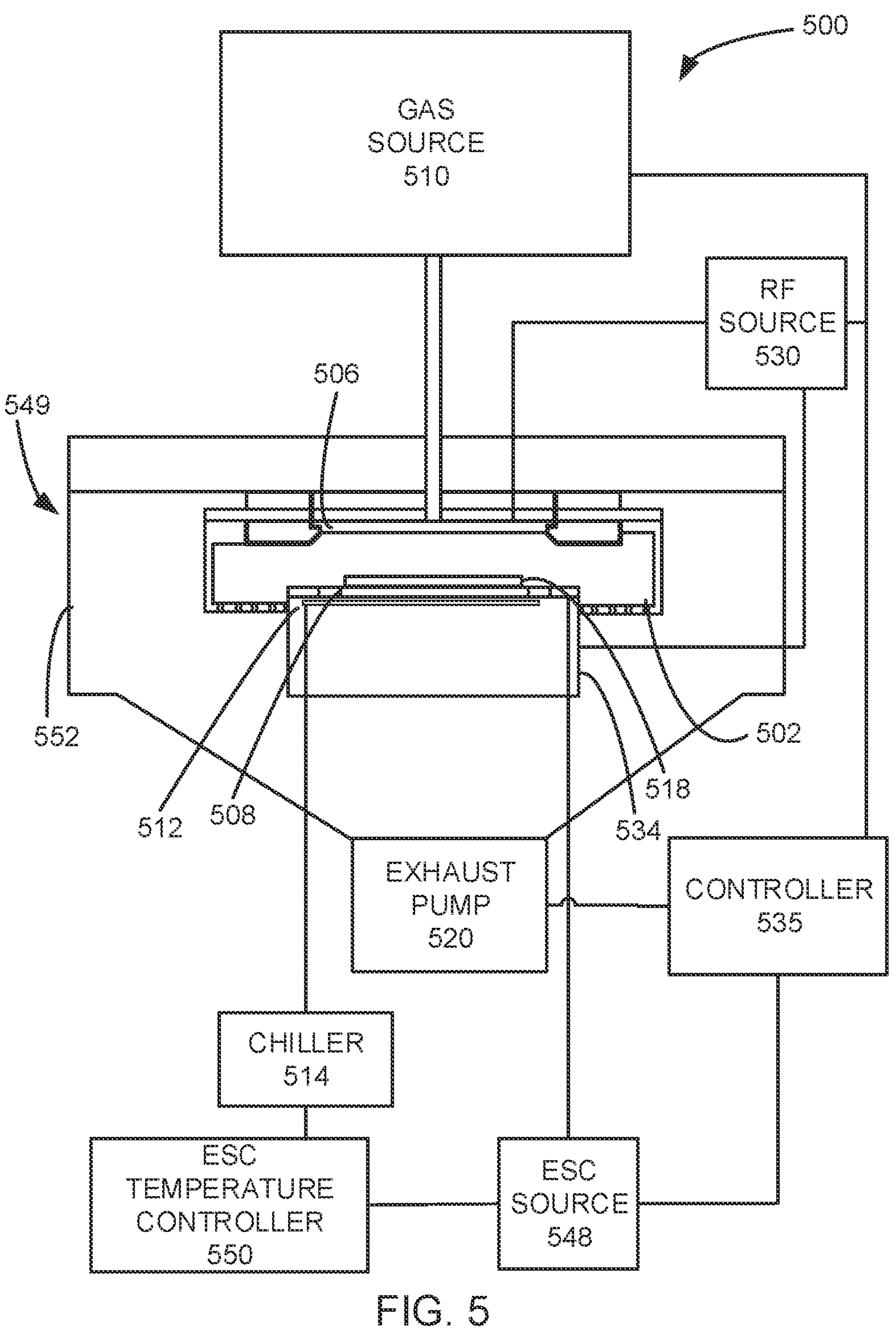
FIG. 5 is a schematic view of a plasma processing chamber that may be used in another embodiment.

FIG. 5 is a schematic view of an etch reactor that may be used in an embodiment. In one or more embodiments, a copper etch chamber 500 comprises a gas distribution plate 506, in the form of a showerhead, providing a gas inlet and an electrostatic chuck (ESC) 534, within a plasma processing chamber 549, enclosed by a chamber wall 552. Within the plasma processing chamber 549, the stack 200 is positioned over the ESC 534. The ESC 534 may provide a bias from the ESC source 548. An etch gas source 510 is connected to the plasma processing chamber 549 through the gas distribution plate 506. The etch gas source 510 may be a modification gas source and an activation gas source. An ESC temperature controller 550 is connected to a chiller 514. In this embodiment, the chiller 514 provides a coolant to channels 512 in or near the ESC 534. A radio frequency (RF) source 530 provides RF power to a lower electrode and/or an upper electrode. In this embodiment, the lower electrode is the ESC 534 and the upper electrode is the gas distribution plate 506. In an exemplary embodiment, 400 kHz, 60 MHz, and optionally 2 MHz, 27 MHz power sources make up the RF source 530 and the ESC source 548. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 535 is controllably connected to the RF source 530, the ESC source 548, an exhaust pump 520, and the etch gas source 510. An example of such an etch chamber is the Exelan Flex™ etch system manufactured by Lam Research Corporation of Fremont, CA. In this embodiment, the copper etch chamber 500 provides capacitively coupled plasma energy. The process chamber can be a CCP (capacitively coupled plasma) reactor or an ICP (inductively coupled plasma) reactor. Other embodiments may use other types of plasma processing chambers such as dielectric and conductive etch chambers or deposition chambers.

Figure 6:
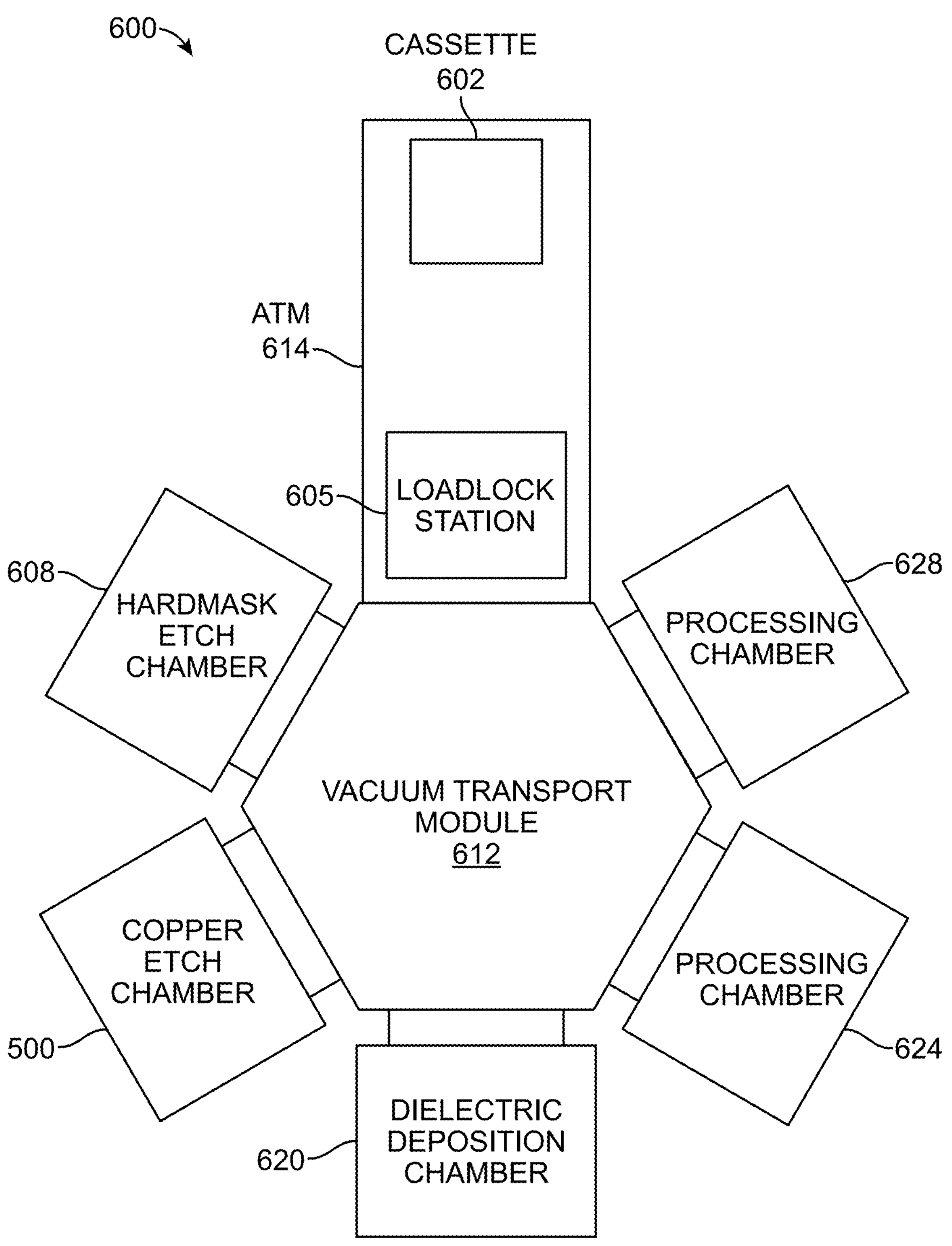
FIG. 6 is a schematic view of a processing tool that may be used in an embodiment.

FIG. 6 is a top schematic view of a processing tool 600, which uses an embodiment. A cassette 602 houses the unprocessed wafers before they are processed and then holds the treated wafers once all processing is complete in the processing tool 600. The cassette 602 can hold many wafers, often as many as 25. An atmosphere transport module (ATM) 614 is used to transport wafers to and from the cassette 602. A load lock station 605 represents at least one device that operates to transfer the wafer back and forth between the atmosphere of the ATM 614 and the vacuum of a vacuum transport module (VTM) 612. The VTM 612 is part of the processing tool and connects to a plurality of processing chambers. There may be different types of processing chambers. In this embodiment, the plurality of processing chambers comprises a halogen etch chamber 608, the copper etch chamber 500, a dielectric deposition chamber 620, an encapsulation chamber 624, and an additional processing chamber 628. A robotic system within the vacuum transport module 612 uses an end effector to move a wafer between the load lock station 605 and the processing chambers. The ATM 614 uses a robotic system to transfer wafers between the cassette 602 and the load lock station 605.

The halogen etch chamber 608 is able to selectively etch a layer using a halogen containing gas. In an embodiment, the halogen etch chamber 608 uses a halogen containing plasma from a halogen gas to etch a hardmask layer over a copper layer with respect to a patterned organic mask layer over the hardmask layer. In this embodiment, the copper etch chamber 500 provides a halogen free etch of the copper layer. The dielectric deposition chamber 620 is able to deposit a dielectric in features between the patterned copper layer. The dielectric deposition chamber 620 is in a vacuum connection with the vacuum transport module in order to encapsulate the patterned copper layer before the patterned copper layer is exposed to the atmosphere. In another embodiment, the encapsulation chamber 624 may be used to encapsulate the patterned copper layer with another encapsulation material. The encapsulation material may be a sacrificial material that is used to prevent the copper layer from being exposed to oxygen and where the sacrificial material is removed during later processing. The additional processing chamber 628 may be used for performing additional processes before the stack is exposed to the atmosphere.

Figure 7:
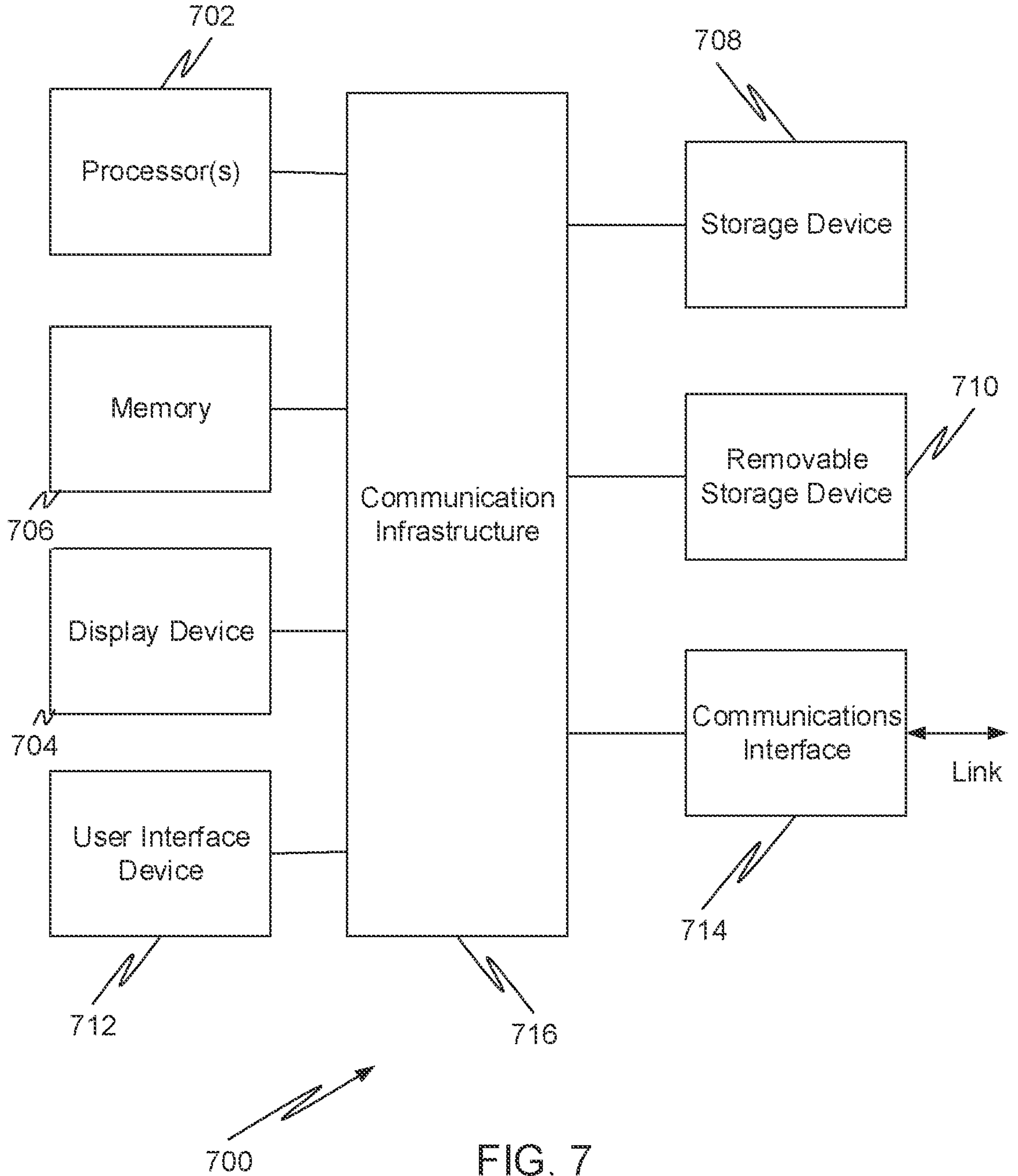
FIG. 7 is a schematic view of a computer system that may be used in practicing an embodiment.

FIG. 7 is a high level block diagram showing a computer system 700, which is suitable for implementing a controller 535 used in embodiments. The computer system 700 may also be used for controlling the entire processing tool 600. The computer system may have many physical forms ranging from an integrated circuit, a printed circuit board, and a small handheld device, up to a huge supercomputer. The computer system 700 includes one or more processors 702, and further can include an electronic display device 704 (for displaying graphics, text, and other data), a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communication interface 714 (e.g., wireless network interface). The communication interface 714 allows software and data to be transferred between the computer system 700 and external devices via a link. The system may also include a communications infrastructure 716 (e.g., a communications bus, cross-over bar, or network) to which the aforementioned devices/modules are connected.

Information transferred via communications interface 714 may be in the form of signals such as electronic, electromagnetic, optical, or other signals capable of being received by communications interface 714, via a communication link that carries signals and may be implemented using wire or cable, fiber optics, a phone line, a cellular phone link, a radio frequency link, and/or other communication channels. With such a communications interface, it is contemplated that the one or more processors 702 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Computer readable media may comprise computer readable code for moving a stack 200 into a halogen etch chamber 608 and computer readable code for transferring a pattern from an organic mask to a hardmask 216 using a halogen etch and computer readable code for transferring the stack from the halogen etch chamber 608 to the copper etch chamber 500 and computer code for etching the copper layer 212 using one of the copper etch processes described above, and computer readable code for transferring the stack 200 from the copper etch chamber to the dielectric deposition chamber 620 or encapsulation chamber 624, and computer readable code for encapsulating the patterned copper layer 212. In an embodiment, the etching of the copper layer 212 is a halogen free process. Etching copper in a chamber using a halogen free process and providing a halogen etch in a different chamber helps reduce copper residue contamination of the stack. The etching of the copper layer 212 in the copper etch chamber 500 creates copper residue in the copper etch chamber 500. If a halogen containing plasma is created in the copper etch chamber 500 the halogen containing plasma could cause the copper residue to deposit on the stack. Having a separate halogen etch chamber 608 and copper etch chamber 500 reduces such contamination.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents that fall within the true spirit and scope of the present disclosure. As used herein, the phrase "A, B, or C" should be construed to mean a logical ("A OR B OR C"), using a non-exclusive logical "OR," and should not be construed to mean 'only one of A or B or C. Each step within a process may be an optional step and is not required. Different embodiments may have one or more steps removed or may provide steps in a different order. In addition, various embodiments may provide different steps simultaneously instead of sequentially.

What is claimed is:

1. A method for atomic layer etching a copper or copper alloy layer over a substrate in a plasma processing chamber, comprising a plurality of cycles, wherein each cycle, comprises:

a) providing a copper modification phase, comprising:

flowing a modification gas into the plasma processing chamber, wherein the modification gas comprises a nitrogen containing gas;

transforming the modification gas into a modification plasma; and exposing the copper or copper alloy to the modification plasma, wherein at least a part of the copper or copper alloy is modified to form copper nitride; and b) after the copper modification phase providing an activation phase, comprising:

flowing an activation gas into the plasma processing chamber, wherein the activation gas, comprises a hydrogen containing gas;

transforming the activation gas into an activation plasma; and exposing the modified copper or copper alloy to the activation plasma, wherein at least a volatile copper or copper alloy complex is formed and wherein the copper nitride is removed and wherein the copper or copper alloy layer is etched, wherein the providing the copper modification phase and providing the activation phase are provided sequentially and cyclically providing an atomic layer etch, wherein the flowing of the modification gas and the flowing of the activation gas are sequentially and cyclically switched in order to sequentially provide the modification phase and the activation phase.

2. The method, as recited in claim 1, wherein the modification gas is halogen free and wherein the activation gas is halogen free.

3. The method, as recited in claim 1, wherein the hydrogen containing gas is hydrogen gas.

4. The method, as recited in claim 3, wherein the nitrogen containing gas comprises nitrogen gas.

5. The method, as recited in claim 1, wherein the copper or copper alloy forms a layer below a mask.

6. The method, as recited in claim 1, further comprising a purge between the modification phase and activation phase.

7. A method for atomic layer etching a copper or copper alloy layer over a substrate in a plasma processing chamber, comprising a plurality of cycles, wherein each cycle, comprises:

a) providing a copper modification phase, comprising:

flowing a modification gas into the plasma processing chamber, wherein the modification gas comprises a nitrogen containing gas;

transforming the modification gas into a modification plasma; and exposing the copper or copper alloy to the modification plasma, wherein at least a part of the copper or copper alloy is modified to form copper nitride; and b) after the copper modification phase providing an activation phase, comprising:

flowing an activation gas into the plasma processing chamber, wherein the activation gas, comprises a hydrogen containing gas;

transforming the activation gas into an activation plasma; and exposing the modified copper or copper alloy to the activation plasma, wherein at least a volatile copper or copper alloy complex is formed and wherein the copper nitride is removed and wherein the copper or copper alloy layer is etched, wherein the providing the copper modification phase and providing the activation phase are provided sequentially and cyclically providing an atomic layer etch, wherein the transforming the modification gas into a modification plasma and the transforming the activation gas into an activation plasma is performed by providing RF power, wherein the RF power is pulsed in order to sequentially provide the modification phase and the activation phase.

8. A method for atomic layer etching a copper or copper alloy layer over a substrate in a plasma processing chamber, comprising a plurality of cycles, wherein each cycle, comprises:

a) a copper modification phase, comprising:

flowing a modification gas into the plasma processing chamber, wherein the modification gas comprises a nitrogen containing gas;

providing a pressure within the plasma processing chamber in the range of 3 mTorr and 300 mTorr;

transforming the modification gas into a modification plasma; and exposing the copper or copper alloy to the modification plasma, wherein at least a part of the copper or copper alloy is modified to form copper nitride; and b) an activation phase, comprising:

flowing an activation gas into the plasma processing chamber, wherein the activation gas, comprises a hydrogen containing gas;

transforming the activation gas into an activation plasma; and exposing the modified copper or copper alloy to the activation plasma, wherein at least a volatile copper or copper alloy complex is formed and wherein the copper nitride is removed and wherein the copper or copper alloy layer is etched.

9. A method for atomic layer etching a copper or copper alloy layer over a substrate in a plasma processing chamber, comprising a plurality of cycles,, comprising a plurality of cycles, wherein each cycle, comprises:

a) a copper modification phase, comprising:

flowing a modification gas into the plasma processing chamber, wherein the modification gas comprises a nitrogen containing gas;

transforming the modification gas into a modification plasma; and exposing the copper or copper alloy to the modification plasma, wherein at least a part of the copper or copper alloy is modified to form copper nitride; and b) an activation phase, comprising:

flowing an activation gas into the plasma processing chamber, wherein the activation gas, comprises a hydrogen containing gas;

transforming the activation gas into an activation plasma;

providing a bias to cause the activation plasma to bombard the modified copper or copper alloy, wherein the providing the bias provides a continuous bias in a range of 50 volts and 500 volts or a pulsed bias in a range of 50 volts and 1500 volts; and exposing the modified copper or copper alloy to the activation plasma, wherein at least a volatile copper or copper alloy complex is formed and wherein the copper nitride is removed and wherein the copper or copper alloy layer is etched.

10. A method for etching copper or copper alloy over a substrate in a plasma processing chamber, comprising:

flowing an etch gas comprising a modification gas comprising a nitrogen containing gas and hydrogen containing gas into the plasma processing chamber;

providing a pressure within the plasma processing chamber in a range of 3 mTorr and 300 mTorr;

transforming the etch gas into a plasma; and providing a bias, wherein the plasma etches at least a part of the copper or copper alloy where the nitrogen containing gas forms copper nitride from the copper or copper alloy and the hydrogen containing gas removes the copper nitride.

11. The method, as recited in claim 10, wherein the etch gas is halogen free.

12. The method, as recited in claim 10, wherein the hydrogen containing gas is hydrogen gas.

13. The method, as recited in claim 12, wherein the nitrogen containing gas comprises nitrogen gas.

14. The method, as recited in claim 10, further comprising maintaining the substrate at a temperature in a range of −40° C. and 20° C.

15. The method, as recited in claim 10, wherein the copper or copper alloy forms a layer below a mask.

16. A method for etching copper or copper alloy over a substrate in a plasma processing chamber,, comprising:

flowing an etch gas comprising a modification gas comprising a nitrogen containing gas and hydrogen containing gas into the plasma processing chamber;

transforming the etch gas into a plasma; and providing a bias, wherein the providing the bias provides a continuous bias in a range of 50 volts and 500 volts or a pulsed bias in a range of 50 volts and 1500 volts and wherein the plasma etches at least a part of the copper or copper alloy where the nitrogen containing gas forms copper nitride from the copper or copper alloy and the hydrogen containing gas removes the copper nitride.

17. A processing tool, comprising:

a vacuum transport module;

a halogen etch chamber, configured to selectively etch a mask layer using a halogen etch, wherein the halogen etch chamber is in vacuum connection with the vacuum transport module; and a copper etch chamber, configured to selectively etch a copper layer with respect to the mask layer, wherein the copper etch chamber is in vacuum connection with the vacuum transport module, wherein the copper etch chamber is an atomic layer etch chamber comprising a hydrogen containing gas source and a nitrogen containing gas source.

18. The processing tool, as recited in claim 17, further comprising a processing chamber configured to deposit dielectric around or encapsulate a patterned copper layer.

* * * * *